United States Patent
Tseng et al.

(10) Patent No.: US 8,421,961 B2
(45) Date of Patent: Apr. 16, 2013

(54) ACTIVE DEVICE ARRAY SUBSTRATE AND FABRICATION METHOD THEREOF

(75) Inventors: Wen-Hsien Tseng, Taichung (TW); Yen-Heng Huang, Taipei County (TW); Chia-Hui Pai, Taichung (TW); Chung-Kai Chen, Taichung County (TW); Wei-Yuan Cheng, Taichung (TW); Wen-Chuan Chen, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 424 days.

(21) Appl. No.: 12/732,196

(22) Filed: Mar. 26, 2010

(65) Prior Publication Data

US 2011/0084289 A1    Apr. 14, 2011

(30) Foreign Application Priority Data

Oct. 14, 2009  (TW) ............................... 98134800 A

(51) Int. Cl.
G02F 1/1333    (2006.01)
(52) U.S. Cl.
USPC ........................................................ 349/106
(58) Field of Classification Search ................... 349/106
See application file for complete search history.

(56) References Cited

U.S. PATENT DOCUMENTS

| 6,038,006 | A | 3/2000 | Sasaki et al. |
| 7,212,262 | B2 * | 5/2007 | Kang ............................. 349/106 |
| 2008/0068537 | A1 * | 3/2008 | Lee et al. ....................... 349/106 |

OTHER PUBLICATIONS

"Office Action of Taiwan counterpart application" issued on Dec. 24, 2012, p1-p11, in which the listed reference was cited.

* cited by examiner

*Primary Examiner* — Uyen Chau N Le
*Assistant Examiner* — Chris Chu
(74) *Attorney, Agent, or Firm* — Jianq Chyun IP Office

(57) ABSTRACT

An active device array substrate including a substrate, a plurality of scan lines, a plurality of data lines, a plurality of active devices, a first passivation layer, a transparent pad layer, a plurality of color filter patterns, a second passivation layer, a plurality of pixel electrodes, and a black matrix layer is provided. Each of the active devices is electrically connected to one of the scan lines and one of the data lines, respectively. The transparent pad layer having a plurality of openings for accommodating the color filter patterns is disposed on the first passivation layer located above the scan lines and the data lines. The first passivation layer, the color filter patterns and the second passivation layer have a plurality of contact windows therein. The black matrix layer is disposed above the transparent pad layer to cover a portion of the pixel electrodes.

8 Claims, 25 Drawing Sheets

US 8,421,961 B2

ACTIVE DEVICE ARRAY SUBSTRATE AND FABRICATION METHOD THEREOF

CROSS-REFERENCE TO RELATED APPLICATION

This application claims the priority benefit of Taiwan application serial no. 98134800, filed on Oct. 14, 2009. The entirety of the above-mentioned patent application is hereby incorporated by reference herein and made a part of specification.

BACKGROUND OF THE INVENTION

1. Field of the Invention

The invention is generally related to an active device array substrate and a fabrication method thereof. More particularly, the invention is related to an active device array substrate capable of improving liquid crystal disclination and a fabrication method thereof.

2. Description of Related Art

With advantages of high definition, small volume, light weight, low driving voltage, low power consumption, and a wide range of applications, a liquid crystal display (LCD) panel has become the mainstream display product in the next generation. The conventional liquid crystal display panel is formed by a color filter substrate, a thin film transistor (TFT) array substrate and a liquid crystal layer sandwiched therebetween. In order to enhance the resolution and the aperture ratio of the LCD panel while also correcting the misalignment when the color filter substrate is joined to the TFT array substrate, a technique of directly integrating the color filter on the pixel array (i.e. Color Filter on Array, or COA) has been proposed.

FIG. 1A is a schematic top view illustrating a conventional active device array substrate. FIG. 1B is a schematic cross-sectional view illustrating a cross-section along a I-I' line depicted in the conventional active device array substrate of FIG. 1A. Referring to FIGS. 1A and 1B, a conventional active device array substrate 100 includes a substrate 110, a plurality of scan lines 120 disposed on the substrate 110, a plurality of data lines 130 disposed on the substrate 110, a plurality of active devices 140 disposed on the substrate 110, a first passivation layer 150, a black matrix layer 160, a plurality of color filter patterns 170, a second passivation layer 180, and a plurality of pixel electrodes 190. By shielding the light emitted from the backlight module (not shown), the aforementioned black matrix layer 160 can shield the light input from the outer surface (i.e. the surface which does not have the active devices disposed thereon) of the substrate 110. Moreover, a material of the black matrix layer 160 is composed of opaque materials or opaque dye materials. In addition, a common line coupled to a common voltage of 0 V, for example, is depicted in FIG. 1A as the unlabeled lines located at the upper and lower sides of the scan lines 120 and arranged parallel to the scan lines 120. Each of the active devices 140 has a gate 140G, a source 140S, a drain 140D, and a channel layer 140C, in which the gate 140G is electrically connected to one of the scan lines 120, the source 140S is electrically connected to one of the data lines 130, and each drain 140D is electrically connected to one of the pixel electrodes 190 respectively. The first passivation layer 150 covers a gate insulating layer GI, the scan lines 120, the data lines 130, and the active devices 140. The black matrix layer 160 is disposed on the first passivation layer 150, wherein the black matrix layer 160 has a plurality of openings 160a, and the black matrix layer 160 is located above the scan lines 120 and the data lines 130.

The color filter patterns 170 are disposed in the openings 160a. The second passivation layer 180 is conformally disposed on the black matrix layer 160 and the color filter patterns 170, and the first passivation layer 150, the color filter patterns 170, and the second passivation layer 180 have a plurality of contact windows W. Moreover, the contact windows W expose a portion of the drains 140D. Herein, the second passivation layer 180 is not formed at the sides of each of the contact windows W. The pixel electrodes 190 are conformally disposed on the second passivation layer 180, wherein each of the pixel electrodes 190 is electrically connected to the drain 140D of each of the active devices 140 through one of the contact windows W, respectively. When each of the pixel electrodes 190 is located at the contact windows W, the lower surface of each of the pixel electrodes 190 is only in contact with the sides and a portion of the upper surface of the color filter patterns 170, the sides of the first passivation layer 150, a portion of the upper surface of each drain 140D, and the sides of the second passivation layer 180.

Since a contact angle A between the color filter patterns 170 and the black matrix layer 160 is an obtuse angle (i.e. greater than 90° but less than 180°), a recess C is produced between the upper surface of color filter patterns 170 and the sides of the black matrix layer 160. Consequently, the pixel electrodes 190 formed in subsequent processes have a recess appearing on the surfaces also. Therefore, when a bias is applied to each of the pixel electrodes 190, due to the recess C, the liquid crystal molecules LC located around the recess C have an issue of liquid crystal disclination. Thereby, the display quality of the LCD panel deteriorates. Moreover, if defects (e.g., the scan lines 120 are broken, the scan lines 120 are electrically shorted with the other conductive lines, the data lines 130 are broken, or the data lines 130 are electrically shorted with the other conductive lines) exist in the scan lines 120, the data lines 130, and the active devices after the black matrix layer 160 is formed, the defects are difficult to inspect by optical manners.

SUMMARY OF THE INVENTION

An aspect of the invention provides an active device array substrate and a fabrication method thereof, for alleviating display quality deterioriation due to liquid crystal disclination.

An aspect of the invention provides an active device array substrate, including a substrate, a plurality of scan lines disposed on the substrate, a plurality of data lines disposed on the substrate, a plurality of active devices disposed on the substrate, a first passivation layer, a transparent pad layer, a plurality of color filter patterns, a second passivation layer, a plurality of pixel electrodes, and a black matrix layer. Each of the active devices is electrically connected to one of the scan lines and one of the data lines, respectively. The first passivation layer covers the scan lines, the data lines, and the active devices. The transparent pad layer is disposed on the first passivation layer, in which the transparent pad layer has a plurality of openings, and the transparent pad layer is located above the scan lines and the data lines. The color filter patterns are disposed in the openings. The second passivation layer is disposed on the transparent pad layer and the color filter patterns, and the first passivation layer, the color filter patterns, and the second passivation layer have a plurality of contact windows. The pixel electrodes are disposed on the second passivation layer, in which each of the pixel electrodes is electrically connected to one of the active devices through one of the contact windows, respectively. The black matrix layer is disposed above the transparent pad layer to cover a portion of the pixel electrodes.

In one embodiment of the invention, the transparent pad layer has a top surface, a bottom surface, and a plurality of side surfaces connected to the top surface and the bottom surface.

In one embodiment of the invention, an area of the top surface is smaller than an area of the bottom surface.

In one embodiment of the invention, a contact angle between the color filter patterns and each of the side surfaces is larger than 90°.

In one embodiment of the invention, a coverage area of the black matrix is larger than the area of the bottom surface.

In one embodiment of the invention, the black matrix layer covers a portion of the transparent pad layer and the color filter patterns.

In one embodiment of the invention, the transparent pad layer and the color filter patterns have a recess therebetween, the black matrix layer covers the recess, and the black matrix layer has a planar upper surface.

In one embodiment of the invention, the aforementioned active device array substrate can further include a plurality of spacers disposed on the black matrix layer.

Another aspect of the invention provides a fabrication method for an active device array substrate. First, a plurality of scan lines, a plurality of data lines, and a plurality of active devices are formed on a substrate. Thereafter, a first passivation layer is formed on the substrate to cover the scan lines, the data lines, and the active devices. Next, a transparent pad layer is formed on the first passivation layer, in which the transparent pad layer has a plurality of openings, and the transparent pad layer is located above the scan lines and the data lines. Thereafter, a plurality of color filter patterns are formed in the openings, and a second passivation layer is formed on the transparent pad layer and the color filter patterns. Thereafter, a plurality of contact windows is formed in the first passivation layer, the color filter patterns, and the second passivation layer. Thereafter, a plurality of pixel electrodes is formed on the second passivation layer, in which each of the pixel electrodes is electrically connected to one of the active devices through one of the contact windows, respectively. Lastly, a black matrix layer is formed above the transparent pad layer to cover a portion of the pixel electrodes.

Another aspect of the invention provides a fabrication method for an active device array substrate. First, a plurality of scan lines, a plurality of data lines, and a plurality of active devices are formed on a substrate. Thereafter, a first passivation layer is formed on the substrate to cover the scan lines, the data lines, and the active devices. Next, a transparent pad layer is formed on the first passivation layer, in which the transparent pad layer has a plurality of openings, the transparent pad layer defines a plurality of contact windows in the openings, and the transparent pad layer is located above the scan lines and the data lines. Thereafter, a plurality of color filter patterns are formed in the openings, and a second passivation layer is formed on the transparent pad layer and the color filter patterns. Thereafter, the first passivation layer on the contact windows is removed to form a plurality of contact. Thereafter, a plurality of pixel electrodes is formed on the second passivation layer, in which each of the pixel electrodes is electrically connected to one of the active devices through one of the contact windows, respectively. Lastly, a black matrix layer is formed above the transparent pad layer to cover a portion of the pixel electrodes.

In one embodiment of the invention, forming the scan lines, the data lines, and the active devices include the following steps. First, a first patterned conductive layer is formed on the substrate, in which the first patterned conductive layer includes the scan lines and a plurality of gates connected to the scan lines. Next, a gate insulating layer is formed on the substrate to cover the first patterned conductive layer. Thereafter, a plurality of channel layers are formed on the gate insulating layer, in which the channel layers are located above the gates. Lastly, the data lines, a plurality of sources, and a plurality of drains are formed on the gate insulating layer.

In one embodiment of the invention, forming the scan lines, the data lines, and the active devices include the following steps. First, a first patterned conductive layer is formed on the substrate, in which the first patterned conductive layer includes the scan lines and a plurality of gates connected to the scan lines. Next, a gate insulating layer, a semiconductor material layer, and a conductive material is formed sequentially on the substrate, so as to cover the first patterned conductive layer. Thereafter, a patterned photoresist layer is formed on a portion of the conductive material layer, in which the patterned photoresist layer has a plurality of first regions and a plurality of second regions, and a thickness of the first regions is smaller than a thickness of the second regions. Thereafter, a portion of the conductive material layer is removed by using the patterned photoresist layer as a mask, so as to form the data lines. Thereafter, the thickness of the patterned photoresist layer is reduced until the first regions are removed. Additionally, by using a plurality of remaining second regions as a mask, a portion of the semiconductor material layer and a portion of the conductive material layer are removed, so as to form a plurality of channel layers, a plurality of sources, and a plurality of drains. Lastly, the leftover second regions are removed.

In one embodiment of the invention, before forming the black matrix layer above the transparent pad layer, the fabrication method further includes inspecting the scan lines, the data lines, and the active devices for defects.

In one embodiment of the invention, forming the color filter patterns include an ink-jet printing process.

In one embodiment of the invention, the aforementioned fabrication method for the active device array substrate can further include forming a plurality of spacers on the black matrix layer.

In summary, since the black matrix layer is disposed above the transparent pad layer according to an aspect of the invention, and the black matrix layer covers a portion of the pixel electrodes, the invention as embodied herein can effectively alleviate display quality deterioration caused by liquid crystal disclination.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3D'-3F' illustrate an alternative embodiment to FIGS. 3D-3F.

FIGS. 4F'-4H' illustrate an alternative embodiment to FIGS. 4F-4H.

DESCRIPTION OF EMBODIMENTS

The First Embodiment

Figure 1A:
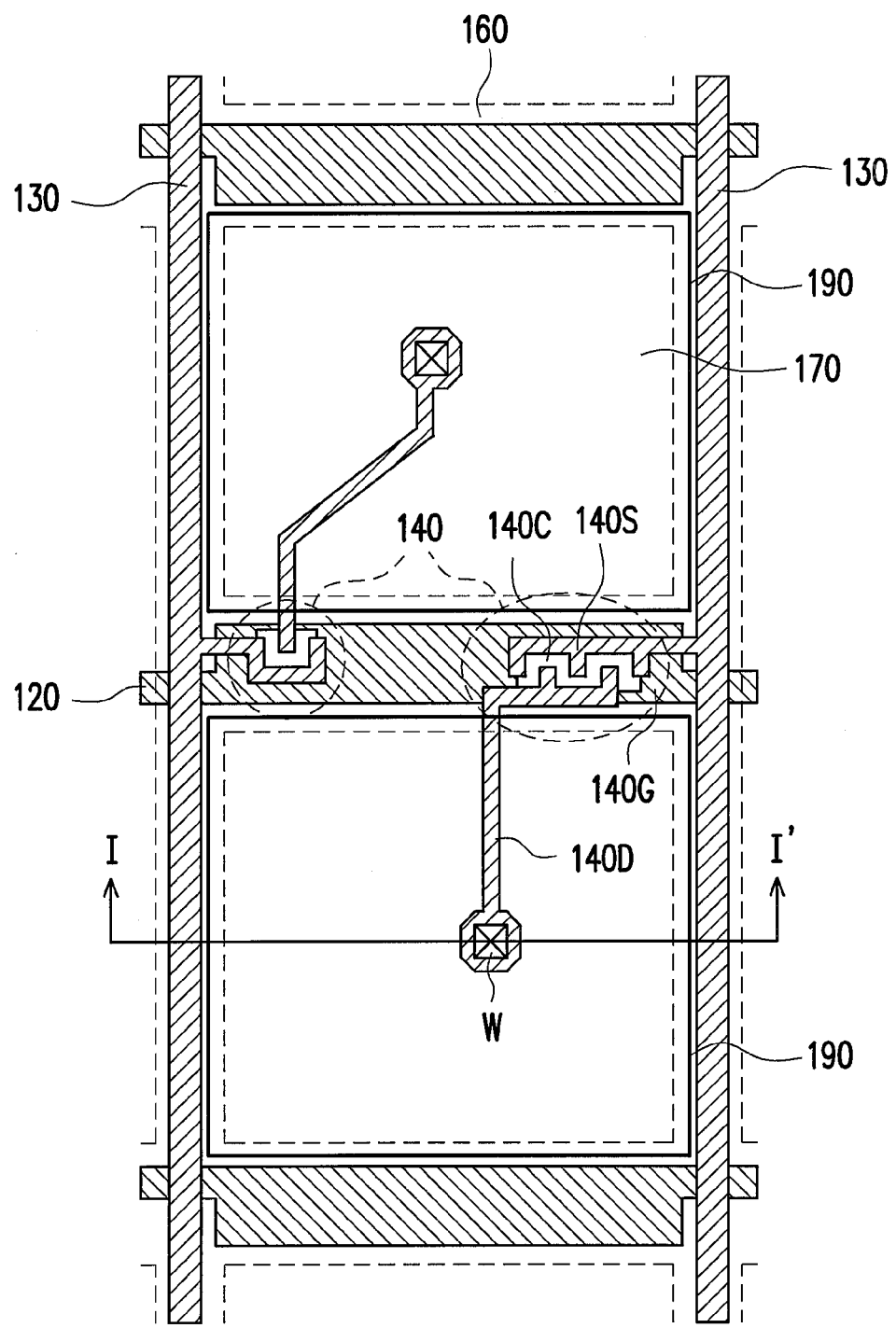
FIG. 1A is a schematic top view illustrating a conventional active device array substrate.
Figure 1B:
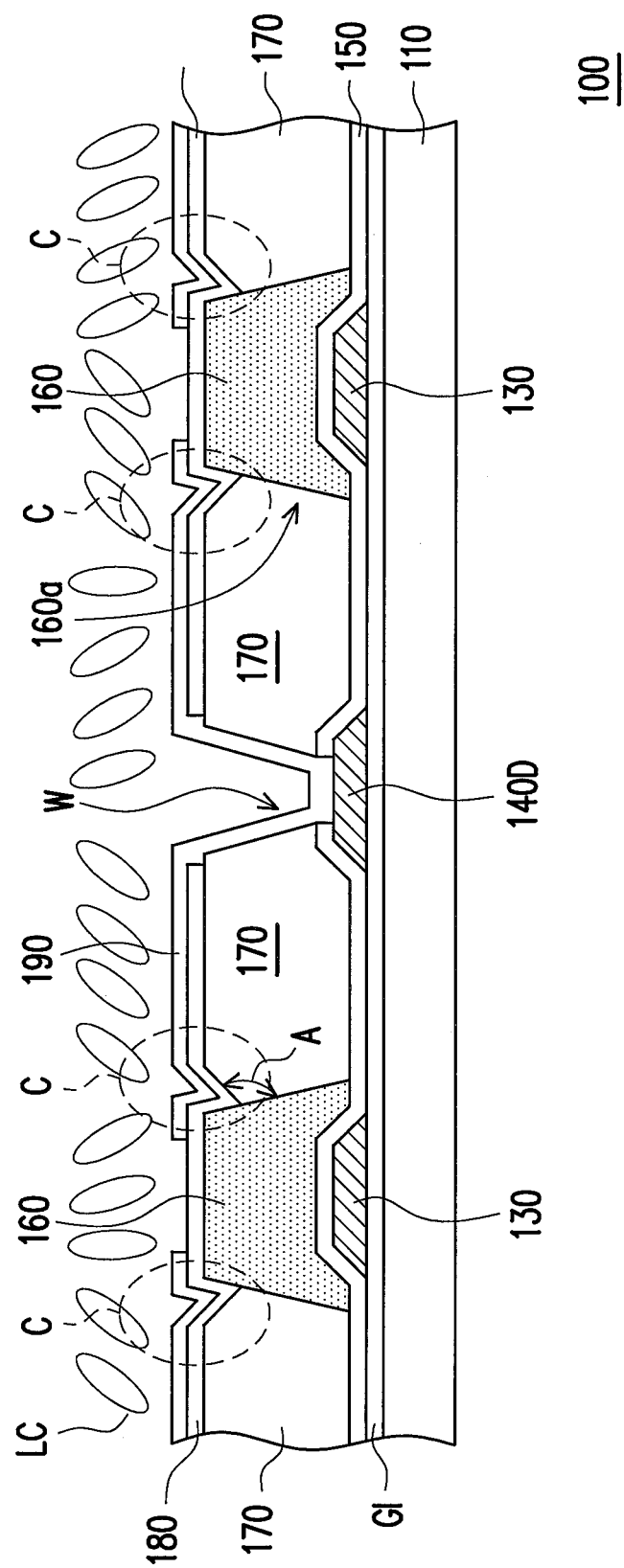
FIG. 1B is a schematic cross-sectional view illustrating a cross-section along a I-I' line depicted in the conventional active device array substrate of FIG. 1A.
Figure 2:
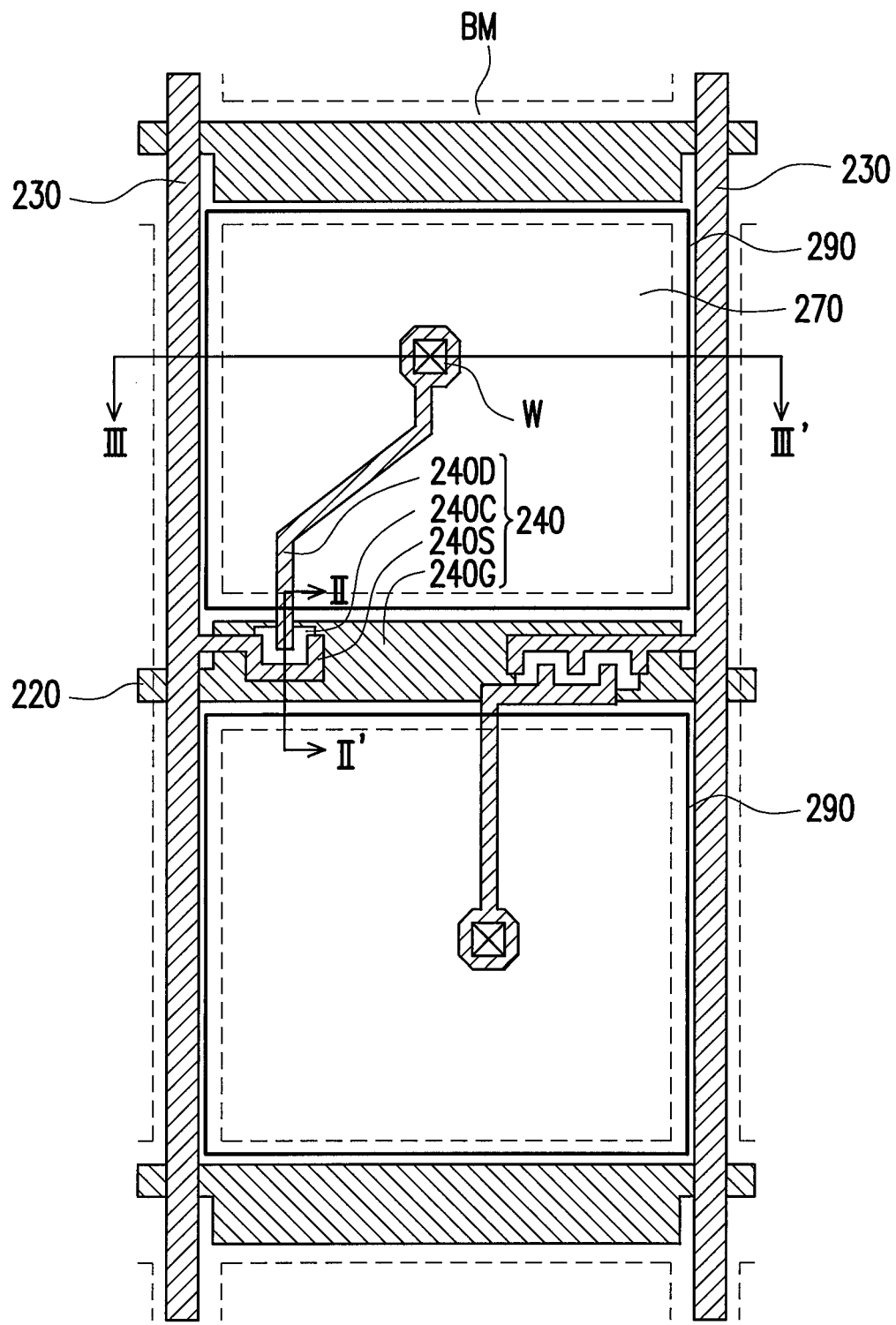
FIG. 2 is a schematic top view illustrating an active device array substrate in accordance with a first embodiment of the invention.

FIG. 2 is a schematic top view illustrating an active device array substrate in accordance with a first embodiment of the invention. FIGS. 3A-3H are schematic cross-sectional views illustrating a fabrication method for the active device array substrate in accordance with the first embodiment of the invention. The left sides of FIGS. 3A-3H are schematic cross-sectional views illustrating cross sections along a II-II' line. The right sides of FIGS. 3A-3H are schematic cross-sectional views illustrating cross sections along a III-III' line.

Figure 3A:
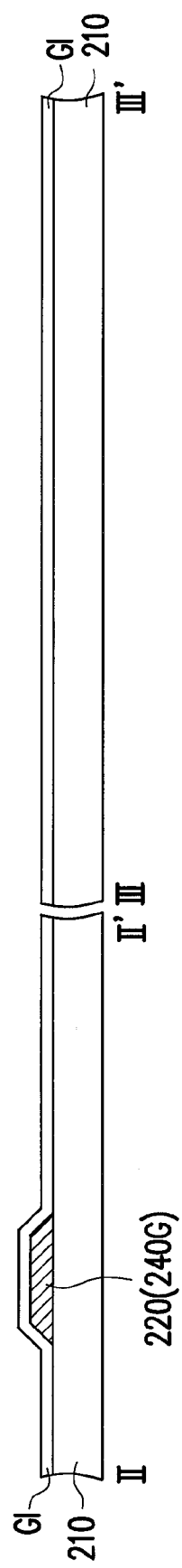
FIGS. 3A-3H are schematic cross-sectional views illustrating a fabrication method for the active device array substrate in accordance with the first embodiment of the invention.
Figure 3B:
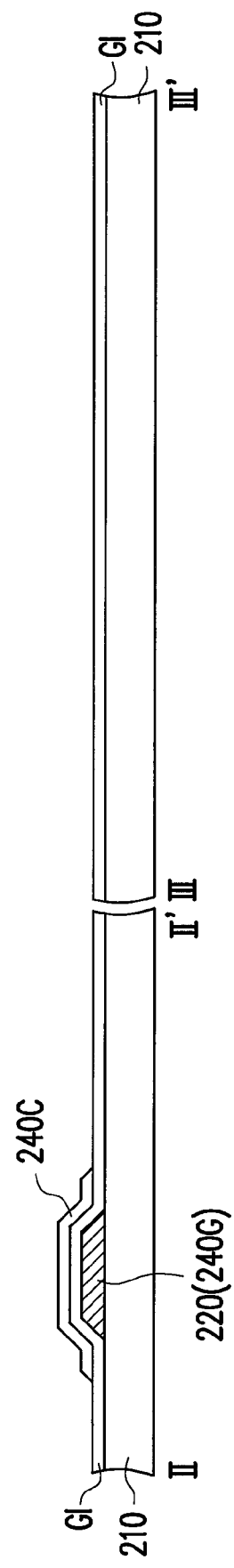
Figure 3C:
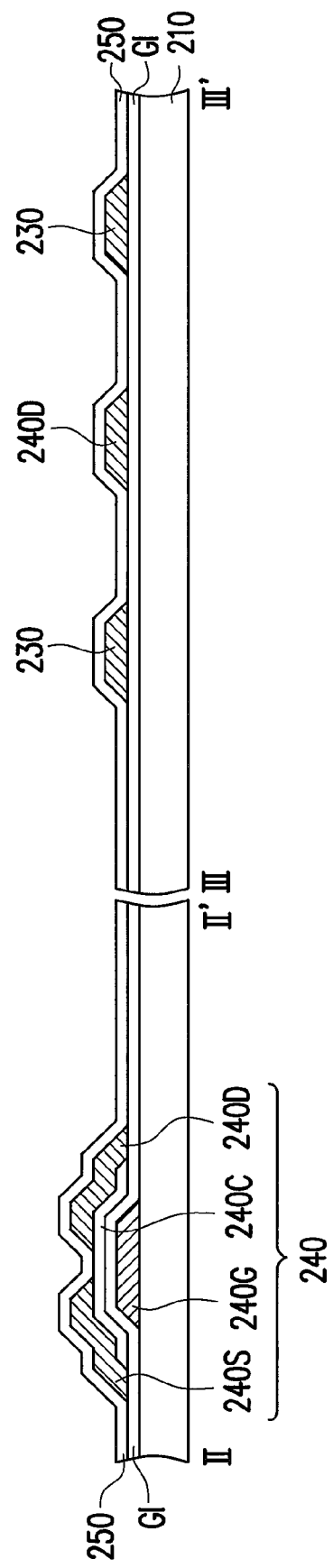
Figure 3D:
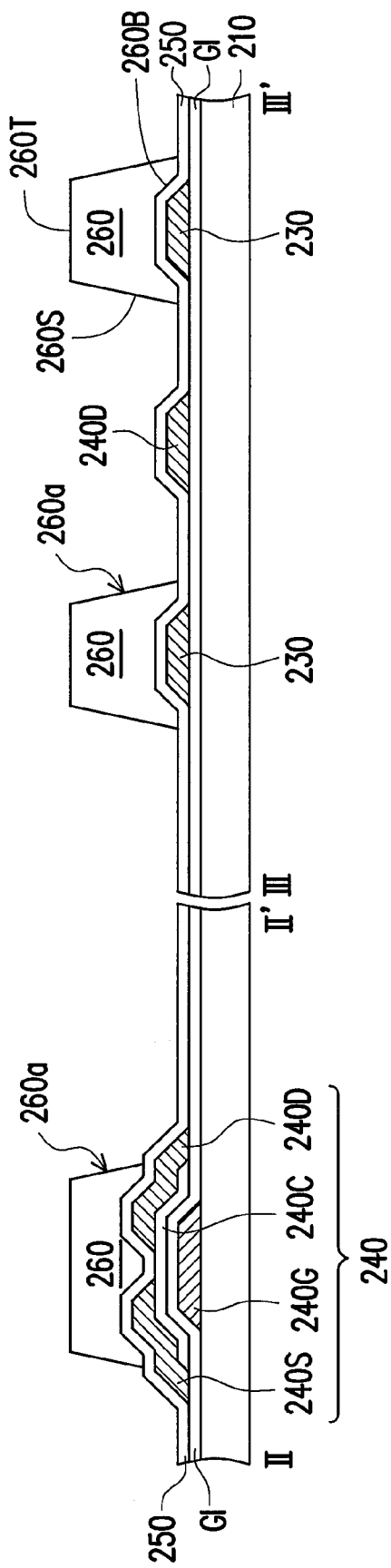
Figure 3D:
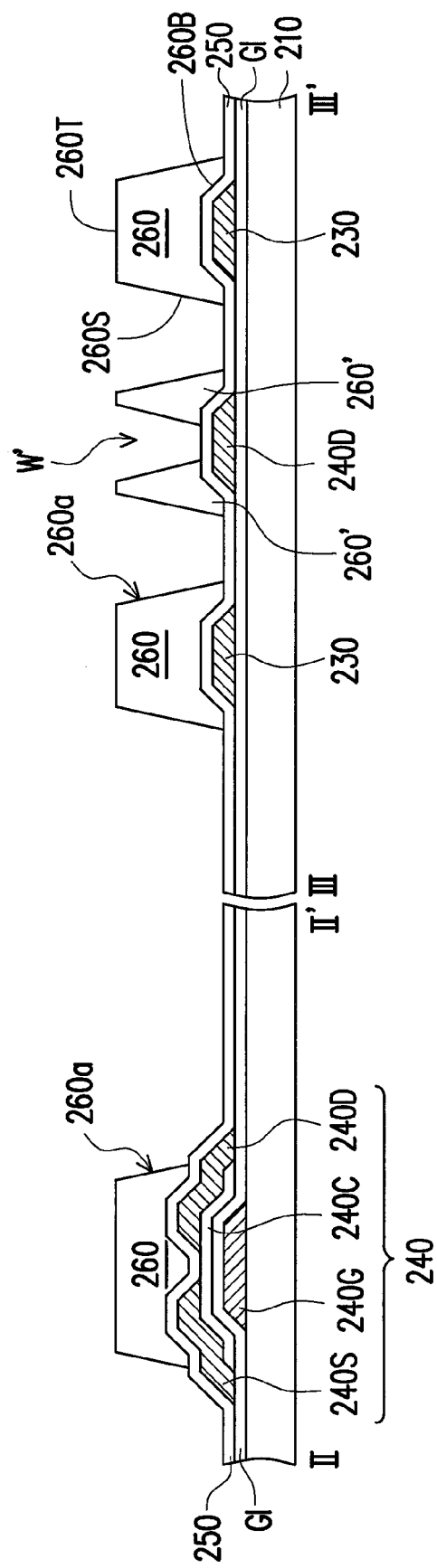
Figure 3E:
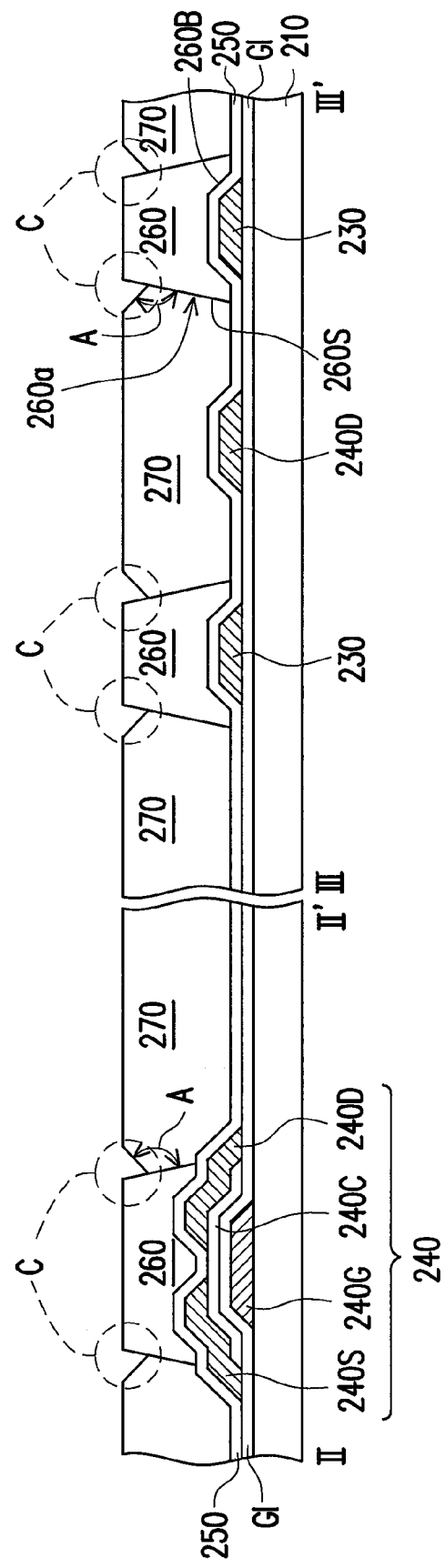
Figure 3E:
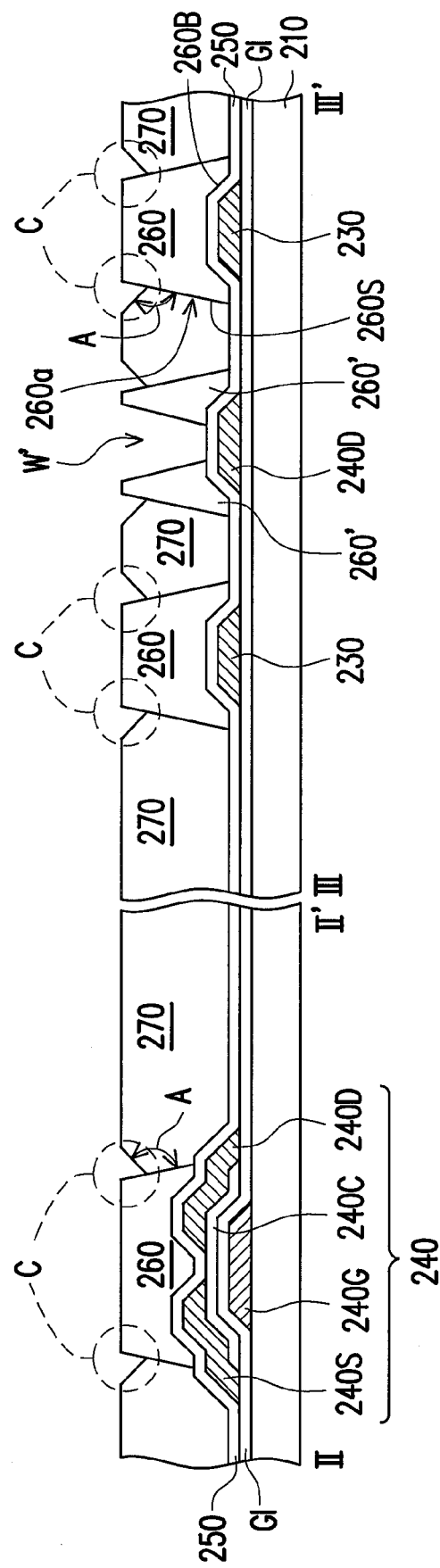
Figure 3F:
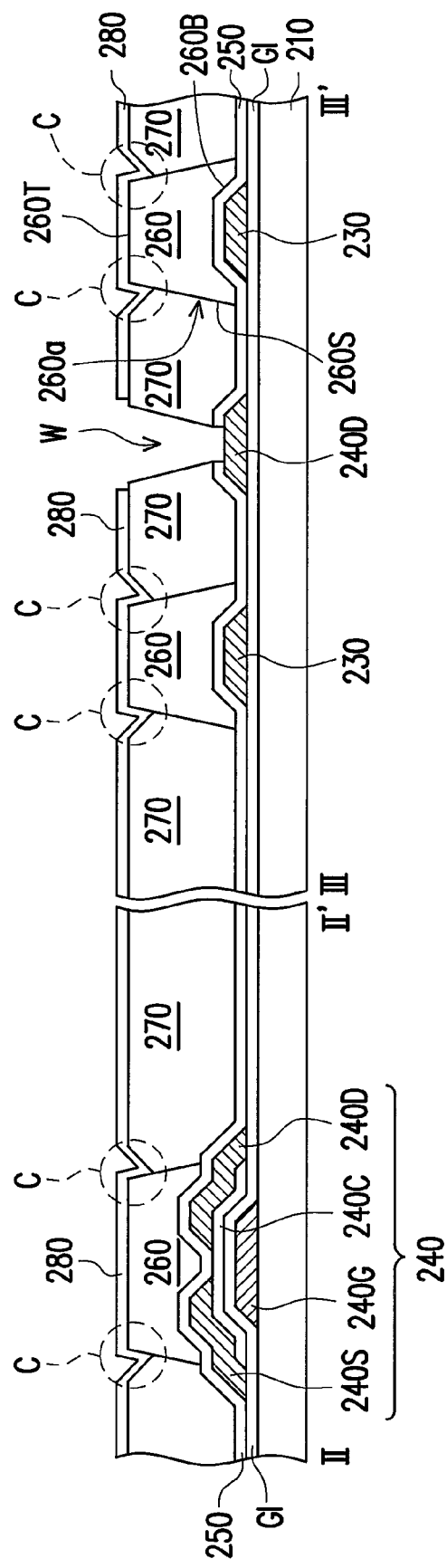
Figure 3F:
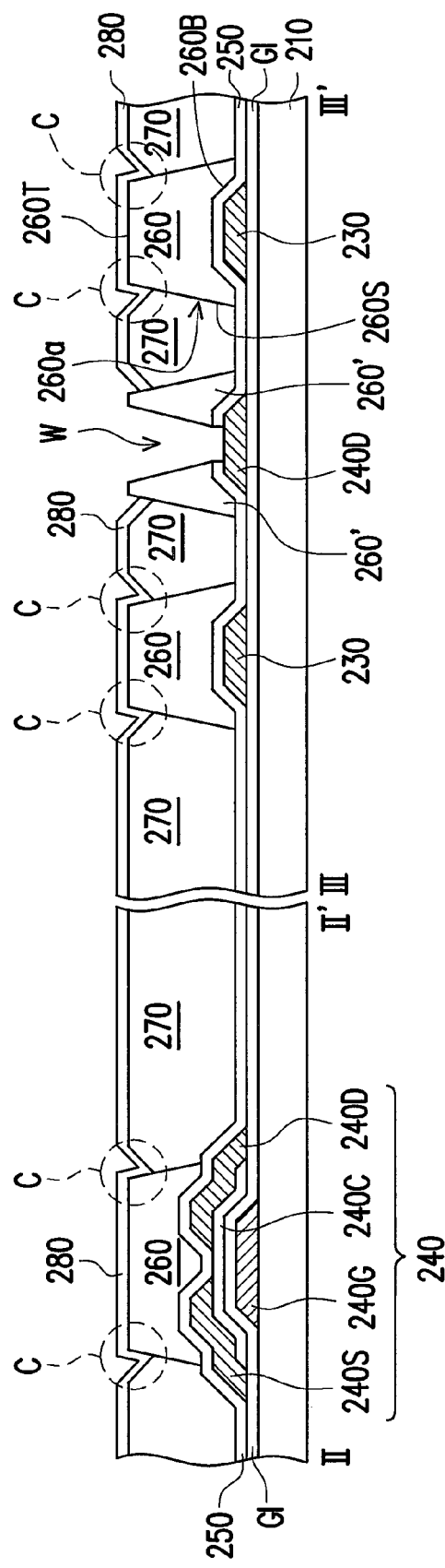
Figure 3G:
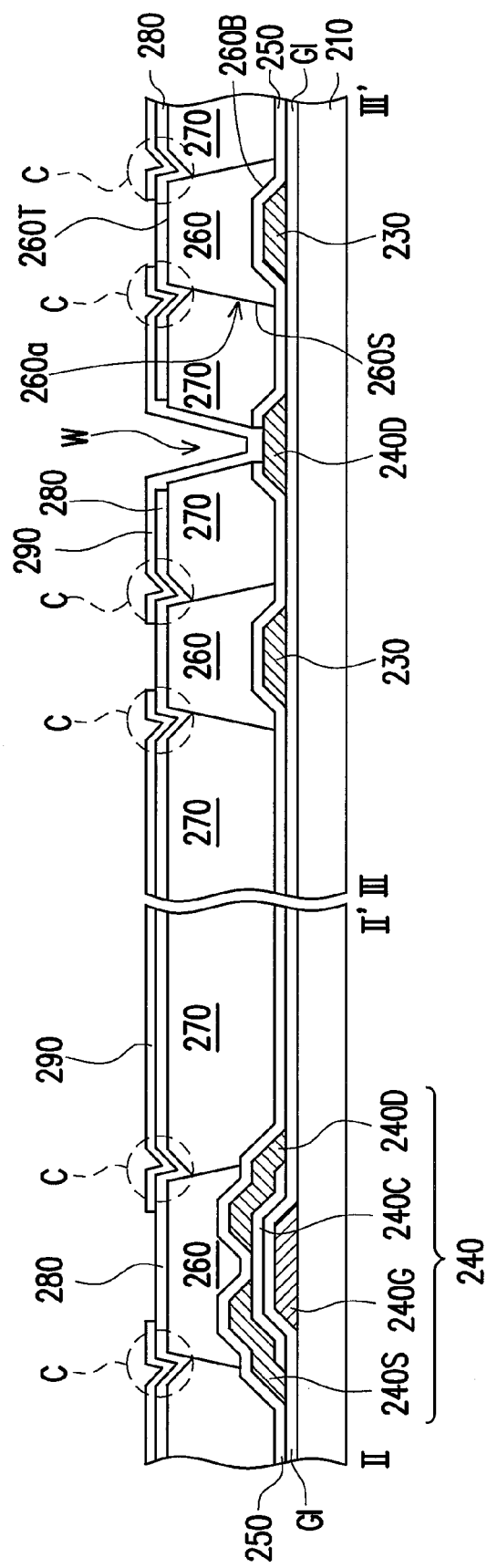
Figure 3H:
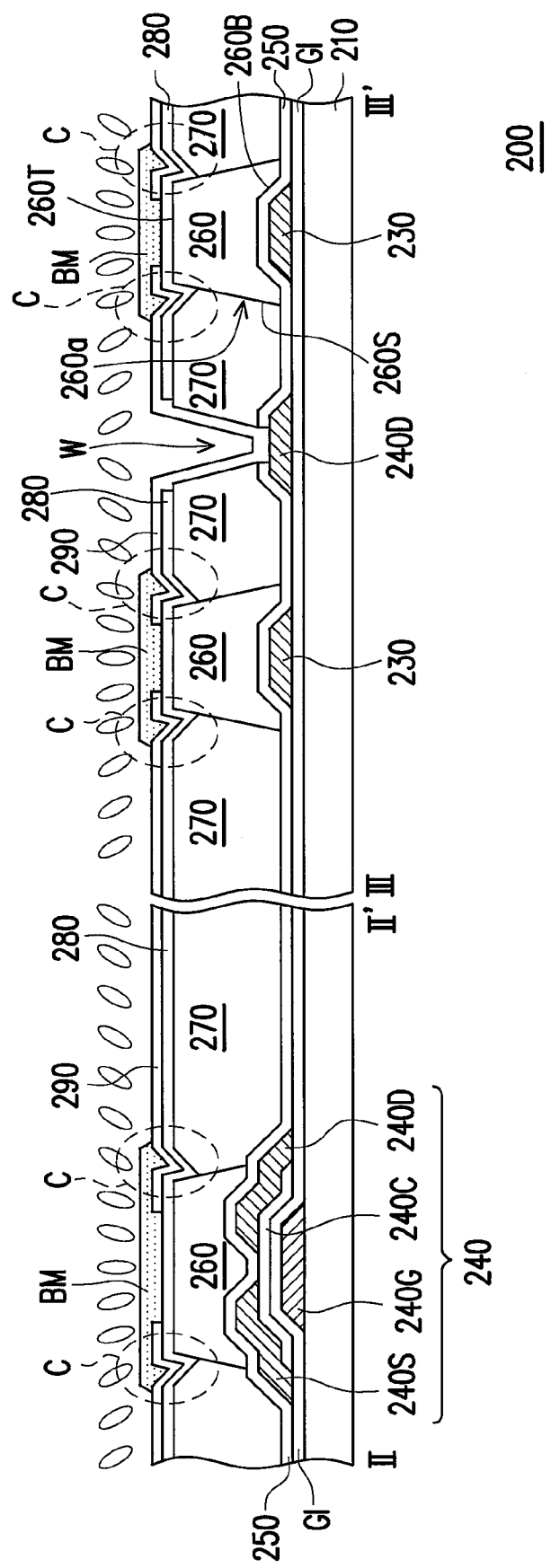

Referring to FIGS. 2 and 3H, an active device array substrate 200 according to the present embodiment of the invention includes a substrate 210, a plurality of scan lines 220 disposed on the substrate 210, a plurality of data lines 230 disposed on the substrate 210, a plurality of active devices 240 disposed on the substrate 210, a first passivation layer 250, a transparent pad layer (or a transparent wall) 260, a plurality of color filter patterns 270, a second passivation layer 280, a plurality of pixel electrodes 290, and a black matrix layer BM. A material of the transparent pad layer 260 is composed of transparent materials or transmissive materials, for example photoresists, transparent dyes, transparent dielectric layers, polyolefne, polythiourea, polyalcohols, polyester, rubber, a thermoplastic polymer, a thermosetting polymer, polyarylene, polymethylmethacrylate, polycarbonate, other suitable materials, derivatives thereof, or a combination thereof. By shielding the light from the backlight module (not shown), the aforementioned black matrix layer BM can shield the light input from the outer surface (i.e. the surface which does not have the active devices 240 disposed thereon) of the substrate 210. Moreover, a material of the black matrix layer BM comprises of opaque materials or reflective materials, such as carbon black, metals, alloys, black dyes, black photoresists, other suitable materials, derivatives thereof, or a combination thereof. The carbon black, black dyes, and black photoresists are dielectric materials, whereas the metals are conductive materials. In addition, a common line coupled to a common voltage, for example 0 V, is depicted in FIG. 2A as the unlabeled lines on the upper and lower sides of the scan lines 220 and arranged parallel to the scan lines 220. Each of the active devices 240 is electrically connected to one of the scan lines 220 and one of the data lines 230, respectively. The first passivation layer 250 covers a gate insulating layer GI, the scan lines 220, the data lines 230, and the active devices 240. The transparent pad layer 260 is disposed on a portion of the first passivation layer 250 and located above the scan lines 220 and the data lines 230. Moreover, the transparent pad layer 260 is located above the active devices 240. The transparent pad layer 260 has a plurality of openings 260a for exposing other portions of the first passivation layer 250. The color filter patterns 270 are disposed in the openings 260a, and the color filter patterns 270 are located above a portion of the first passivation layer 250. The second passivation layer 280 is conformally disposed on the transparent pad layer 260 and the color filter patterns 270, and the first passivation layer 250, the color filter patterns 270, and the second passivation layer 280 have a plurality of contact windows W. The contact windows W expose a portion of a drain 240D of each of the active devices 240. The pixel electrodes 290 are conformally disposed on the second passivation layer 280, in which each of the pixel electrodes 290 is electrically connected to each of the active devices 240 through one of the contact windows W, respectively. It should be noted that the pixel electrodes 290 located at the two opposing sides of the scan lines 220 are electrically insulated from each other, so as to expose a portion of the second passivation layer 280. The black matrix layer BM is disposed above the transparent pad layer 260 so as to cover a portion of the pixel electrodes 290. The bottom surface of the black matrix layer BM is in contact with an upper surface of the second passivation layer 280 not covered by the pixel electrodes 290 and the pixel electrodes 290 around the recess C. In other words, the black matrix layer BM can fill the recess C, and the black matrix layer BM has a planar upper surface. For example, when the upper surface of the black matrix layer BM is planar, the black matrix layer BM can alleviate the liquid crystal disclination caused by the recess C. Moreover, since the material of the black matrix layer BM is composed of dielectric materials, the coupling effect reduced by the black matrix layer BM can be utilized to further reduce the disclination issue of the liquid crystal molecules around the recess C. When the material of the black matrix layer BM is composed of conductive materials, the capacitor voltage reduction effect does not exist, but the black matrix layer BM can still alleviate the disclination issue of the liquid crystal molecules in the liquid crystal layer caused by the recess C. It should be noted that when the material of the black matrix layer BM is composed of conductive materials, the black matrix layer BM can be electrically insulated from the pixel electrodes 290 by configuring the insulating layer between the black matrix layer BM and the pixel electrodes 290

As shown in FIG. 3H, when the pixel electrodes 290 are located at the contact windows W, the lower surface of the pixel electrodes 290 contacts the sidewalls of the color filter patterns 270 and a portion of the upper surface of the drains 240D. In other embodiments of the invention, in order to protect the color filter patterns 270 in the contact windows W, the second passivation layer 280 can be extended into the contact windows W. Under this condition, the second passivation layer 280 is in contact with the upper surfaces of the drains 240D of the active devices 240. In other words, the lower surface of the second passivation layer 280 located at the contact windows W is in contact with the sides of the color filter patterns 270. Moreover, the first passivation layer 250 and the second passivation layer 280 are in contact with the upper surfaces of the drains 240D of the active devices 240. At this instance, the pixel electrodes 290 located at the contact windows W are in contact with the upper surface of the second passivation layer 280 and the upper surfaces of the drains 240D of the active devices 240.

In the present embodiment of the invention, each of the active devices 240 has a gate 240G, a source 240S, a drain 240D, and a channel layer 240C. The gate 240G is electrically connected to one of the scan lines 220, the source 240S is electrically connected to one of the data lines 230, and the drain 240D is electrically connected to the pixel electrodes 290. In other words, the pixel electrodes 290 are electrically connected to the drains 240D of the active devices 240 through the contact windows W.

It should be noted that, the transparent pad layer 260 according to the present embodiment possesses good transmittance, such that the scan lines 220 and the data lines 230 located below the transparent pad layer 260 can be optically inspected and determined with ease. In other words, even if defects (e.g., the scan lines 220 are broken, the scan lines 220 are electrically shorted with the other conductive lines, the data lines 230 are broken, or the data lines 230 are electrically shorted with the other conductive lines) appear on the scan lines 220 and the data lines 230 after the transparent pad layer 260 is formed, such defects can still be detected and repaired.

With reference to FIGS. 3A-3H, a detailed description is provided hereinafter for a fabrication method of the active device array substrate.

Referring first to FIG. 3A, a first patterned conductive layer is formed on the substrate 210, wherein the first patterned conductive layer includes a plurality of scan lines 220 and a plurality of gates 240G connected to the scan lines 220. In one embodiment of the invention, the first patterned conductive layer can further include a common line (not shown) arranged parallel to the scan lines 220. The common line and the scan lines 220 are separated and electrically insulated from each other. In the present embodiment of the invention, the first patterned conductive layer is formed by a first photolithography and etch process (1$^{st}$ PEP). Thereafter, a gate insulating layer GI is formed on the substrate 210 so as to cover the aforementioned scan lines 220, gates 240G and the substrate 210. Moreover, the gate insulating layer GI covers the common line (not shown).

Referring next to FIG. 3B, a channel layer 240C is formed on the gate insulating layer GI above the gates 240G. In the present embodiment of the invention, a material of the channel layers 240C is composed of semiconductor materials, and the channel layers 240C are formed by a second photolithography and etch process (2$^{nd}$ PEP). In other embodiments of the invention, an ohmic contact layer may be further included on the channel layers 240C. For example, a material of the ohmic contact layer is composed of N-type doped semiconductor materials.

Referring next to FIG. 3C, a second patterned conductive layer is formed on the gate insulating layer GI, in which the second patterned conductive layer includes a plurality of data lines 230, as well as a plurality of sources 240S and a plurality of drains 240D connected to the data lines 230. In the present embodiment of the invention, the data lines 230, the sources 240S, and the drains 240D are formed by a third photolithography and etch process (3$^{rd}$ PEP). As shown in FIG. 3C, the gates 240G, the channel layers 240C, the sources 240S, and the drains 240D form the active devices 240. After fabricating the active devices 240, a first passivation layer 250 is formed on the gate insulating layer GI, so as to cover the scan lines 220, the data lines 230, and the active devices 240. The first passivation layer 250 can further cover the gate insulating layer GI.

Referring next to FIG. 3D, a transparent pad layer 260 is formed on the first passivation layer 250, and the transparent pad layer 260 is patterned by a fourth photolithography and etch process (4$^{th}$ PEP), wherein the transparent pad layer 260a has a plurality of openings 260a. The openings 260a expose a portion of the first passivation layer 250. In the present embodiment of the invention and as shown in FIG. 2, the passivation layer 260 is located above the scan lines 220 and the data lines 230. Clearly, the transparent pad layer 260 according to the present embodiment can also cover the active devices 240. As shown in FIG. 3D, the transparent pad layer 260 has a top surface 260T, a bottom surface 260B, and a plurality of side surfaces 260S connected between the top surface 260T and the bottom surface 260B. In addition, the area of the top surface 260T is substantially smaller than the area of the bottom surface 260B, for example.

Referring next to FIG. 3E, a color filter pattern 270 is respectively formed in each of the openings 260a of the transparent pad layer 260. Specifically, the color filter patterns 270 are formed on the first passivation layer 250 exposed by the transparent pad layer 260. In the present embodiment of the invention, the color filter patterns 270 include red color filter patterns, green color filter patterns, and bluecolor filter patterns, for example. Moreover, the color filter patterns 270 are formed by an ink-jet printing process, for instance. Since a contact angle between the color filter patterns 270 and each of the side surfaces 260S of the transparent filter layer 260 is an obtuse angle larger than 90° but smaller than 180°, there are recess C between the color filter patterns 270 and the transparent filter layer 260.

Referring next to FIG. 3F, a second passivation layer 280 is formed on the transparent pad layer 260 and the color filter patterns 270. Thereafter, by a fifth photolithography and etch process (5$^{th}$ PEP), a plurality of contact windows W are formed in the first passivation layer 250, the color filter patterns 270, and the second passivation layer 280. As clearly shown in FIG. 3F, the contact windows W pass through the first passivation layer 250, the color filter patterns 270, and the second passivation layer 280, so as to expose a portion of the drains 240D. As shown in FIG. 3F, the second passivation layer 280 has not extended in the contact windows W. However, in other embodiments of the invention, in order to protect the color filter patterns 270 in the contact windows W, the second passivation layer 280 can be extended in the contact windows W. Consequently, the sides of the second passivation layer 280 contact a portion of the upper surfaces of the drains 240D. In other words, the lower surface of the second passivation layer 280 at the contact windows W is in contact with the sidewall of the color filter patterns 270. Moreover, the first passivation layer 250 and the second passivation layer 280 are in contact with a portion of the upper surfaces of the drains 240D.

FIGS. 3D'-3F' illustrate an alternative embodiment of FIGS. 3D-3F. Referring to FIGS. 3D'-3F', in order to further reduce the number of photolithography processes, a contact window W' can be defined by a transparent pad layer 260' (as shown in FIG. 3D'), the color filter patterns 270 can be formed only in the openings 260a between the transparent pad layer 260' and the transparent pad layer 260 (as shown in FIG. 3E'). The first passivation layer 250 not covered by the transparent pad layer 260' and the color filter patterns 270 can be easily removed (as shown in FIG. 3F'). In other words, while removing the first passivation layer 250 not covered by the transparent pad layer 260' and the color filter patterns 270, the transparent pad layer 260' and the color filter patterns 270 are used as a hard mask.

Thereafter, referring to FIG. 3G, a plurality of pixel electrodes are formed on the second passivation layer 280, wherein each of the pixel electrodes is electrically connected with the corresponding drain 240D through one of the contact windows W. It should be noted that the pixel electrodes 290 located at the two sides of the scan lines 220 are electrically insulated from each other, so as to expose a portion of the second passivation layer 280. In the present embodiment of the invention, the pixel electrodes 290 are formed by a sixth photolithography and etch process ($6^{th}$ PEP). It should be mentioned that the second passivation layer 280 has not been extended in the contact windows W, as shown in FIG. 3F. At this instance, the lower surface of the pixel electrodes 290 is in contact with the sidewall of the color filter patterns 270 and a portion of the upper surfaces of the drains 240D. In other embodiments of the invention, the second passivation layer 280 may extend into the contact windows W, such that the second passivation layer 280 is in contact with the upper surface of the drains 240D of the active devices 240. In other words, the lower surface of the second passivation layer 280 at the contact windows W is in contact with the sidewall of the color filter patterns 270. Moreover, the first passivation layer 250 and the second passivation layer 280 are in contact with the upper surfaces of the drains 240D of the active devices 240 simultaneously. At this instance, the pixel electrodes 290 at the contact windows W are in contact with the upper surface of the second passivation layer 280 and the upper surfaces of the drains 240D of the active devices 240.

Referring to FIG. 3H, in order to avoid the negative effects caused by the recess C, for example the liquid crystal disclination effect, a black matrix layer BM is formed above the transparent pad layer 260 so as to cover a portion of the pixel electrodes 290. At this instance, a portion of the upper surface of the second passivation layer 280 not covered by the pixel electrodes 290 and the pixel electrodes 290 around the recess C are in contact with the lower surface of the black matrix layer BM. In other words, the black matrix layer BM can fill the recess C, and the black matrix layer BM has a planar upper surface. For example, when the upper surface of the black matrix layer BM is planar, the black matrix layer BM can alleviate the issue of the liquid crystal disclination caused by the recess C. Moreover, since the material of the black matrix layer BM is composed of dielectric materials, the capacitor voltage reducing effect of the black matrix layer BM can be utilized to further prevent the disclination issue for the liquid crystal molecules at the recess C. When the material of the black matrix layer BM is composed of conductive materials, the capacitor voltage reduction effect does not exist, but the black matrix layer BM can still alleviate the disclination issue of the liquid crystal molecules in the liquid crystal layer caused by the recess C. It should be noted that when the material of the black matrix layer BM is composed of conductive materials, the black matrix layer BM can be electrically insulated from the pixel electrodes 290 by configuring the insulating layer between the black matrix layer BM and the pixel electrodes 290. After the black matrix layer BM is formed, the black matrix layer BM can effectively alleviate the deterioration of display quality due to liquid crystal disclination because the black matrix layer BM has a planar upper surface. As shown in FIG. 3H, the black matrix layer BM has a coverage area that is larger than the area of the lower surface 260B of the transparent pad layer 260, for example. Additionally, as shown in FIG. 3H, the black matrix layer BM covers a portion of the transparent pad layer 260 and the color filter patterns 270.

It should be noted that, in order to maintain a cell gap between the aforementioned active device array substrate 200 and an opposing substrate, the present embodiment can selectively form a plurality of spacers having a proper height on the black matrix layer BM.

The Second Embodiment

FIGS. 4A-4J are schematic cross-sectional views illustrating a fabrication method of an active device array substrate in accordance with a second embodiment of the invention. The fabrication method for the active device array substrate according to the present embodiment of the invention is similar to the structure and fabrication method of the active device array substrate according to the first embodiment of the invention. A detailed description is provided hereinafter for a fabrication method of the active devices 240 according to the present embodiment of the invention.

Figure 4A:
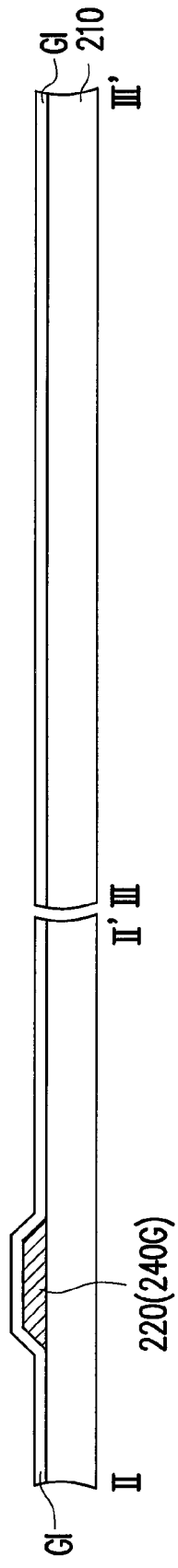
FIGS. 4A-4J are schematic cross-sectional views illustrating a fabrication method for an active device array substrate in accordance with a second embodiment of the invention.

Referring first to FIG. 4A, a first patterned conductive layer is formed on the substrate 210, wherein the first patterned conductive layer includes a plurality of scan lines 220 and a plurality of gates 240G connected to the scan lines 220. In the present embodiment of the invention, the first patterned conductive layer can further include a common line (not shown) arranged parallel to the scan lines 220. Additionally, the common line and the scan lines 220 are separated and electrically insulated from each other. In the present embodiment of the invention, the first patterned conductive layer is formed by the $1^{st}$ photolithography and etch process ($1^{st}$ PEP). Thereafter, a gate insulating layer GI is formed on the substrate 210 to cover the aforementioned scan lines 220, gates 240G, and the substrate 210. Furthermore, the gate insulating layer GI covers the common line (not shown).

Figure 4B:
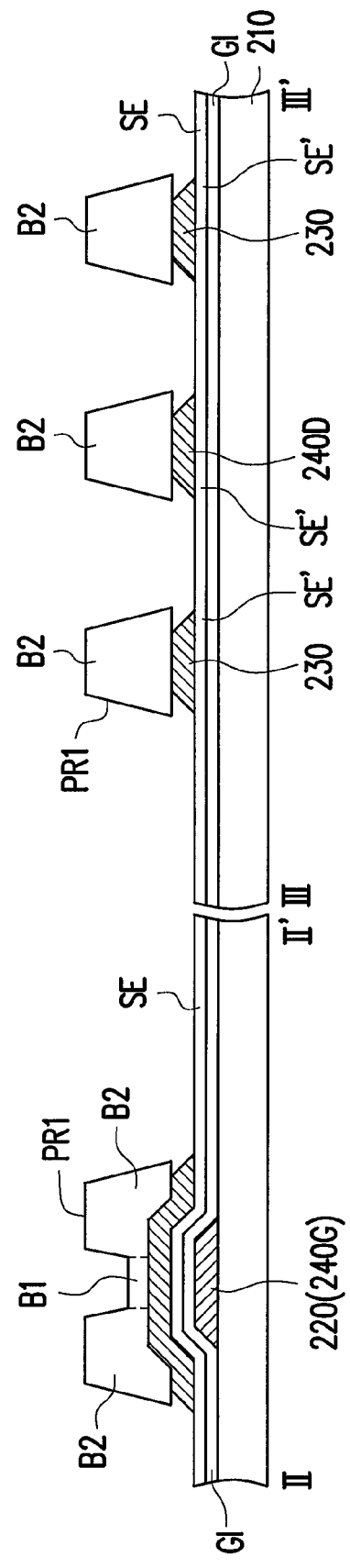

Referring next to FIG. 4B, the gate insulating layer GI, a semiconductor material layer SE, and a conductive material layer (not shown) are formed sequentially on the substrate 210. Thereafter, a patterned photoresist layer PR1 is formed on a portion of the conductive material layer, wherein the patterned photoresist layer PR1 has a plurality of first regions and a plurality of second regions, and a thickness of the first regions is smaller than a thickness of the second regions. Thereafter, a portion of the conductive material layer is removed by using the patterned photoresist layer PR1 as a mask, so as to form the data lines 230.

Figure 4C:
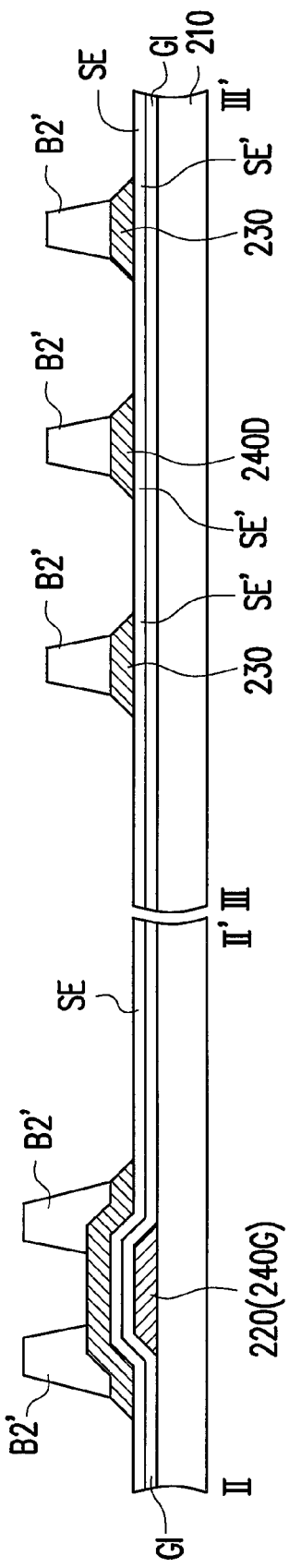
Figure 4D:
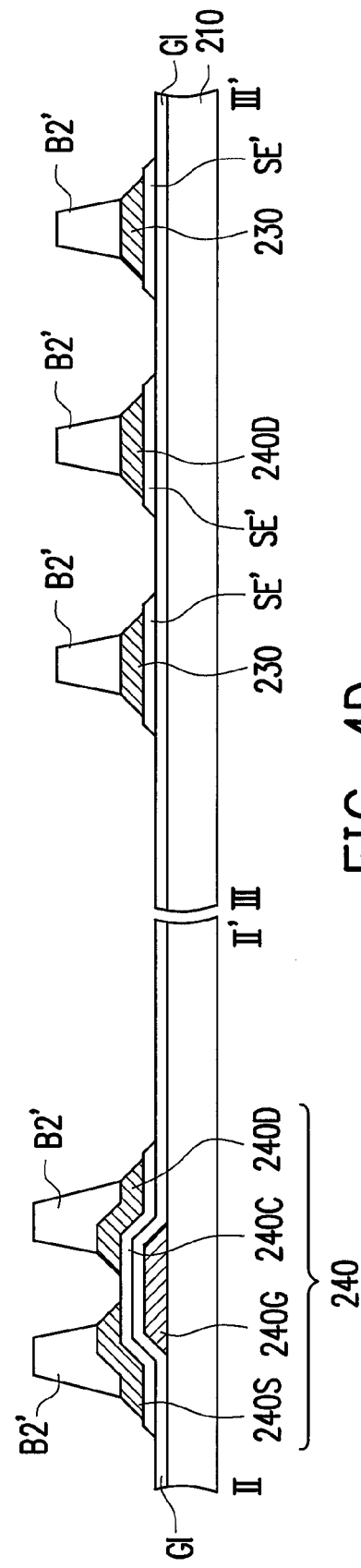

Next, referring to FIGS. 4C to 4D, the thickness of the patterned photoresist layer is reduced until the first regions are removed, so as to expose the semiconductor material layer SE located above the gates 240G. Additionally, a portion of the semiconductor material layer SE and a portion of the conductive material layer are removed by using a plurality of remaining second regions B2' as a mask, so as to form the channel layers 240C, the sources 240S, and the drains 240D. Thereafter, the remaining second regions B2' are removed. In the present embodiment of the invention, a material of the channel layers 240C is composed of semiconductor materials. In other embodiments of the invention, an ohmic contact layer can be formed on the channel layers 240C. For example, a material of the ohmic contact layer is composed of N-type doped semiconductor materials. As shown in FIG. 4D, the gates 240G, the channel layers 240C, the sources 240S, and the drains 240D form the active devices 240.

As shown in FIGS. 4B-4D, since the channel layers 240C, the sources 240S, and the drains 240D in the active devices 240 are formed by the second photolithography and etch process ($2^{nd}$ PEP), such PEP is a so-call half-tone mask process, a gray-mask process, or a slit-mask process, the number of overall PEP can be reduced. Consequently, the manufacturing costs and labor time are lowered.

Since the active devices 240 is formed by a process that is different from the process disclosed in the first embodiment, a semiconductor material layer SE' is disposed between the data lines 230 and the gate insulating layer GI. It should be noted that, the edges of the channel layers 240C in the active device fabricated by single PEP may exceed the sources/drains (240S/240D) of the active devices 240, and the edges of the semiconductor material layer SE' located under the data lines 230 may exceed the edges of the data lines 230. Consequently, a stacking structure of smooth taper is formed.

Figure 4E:
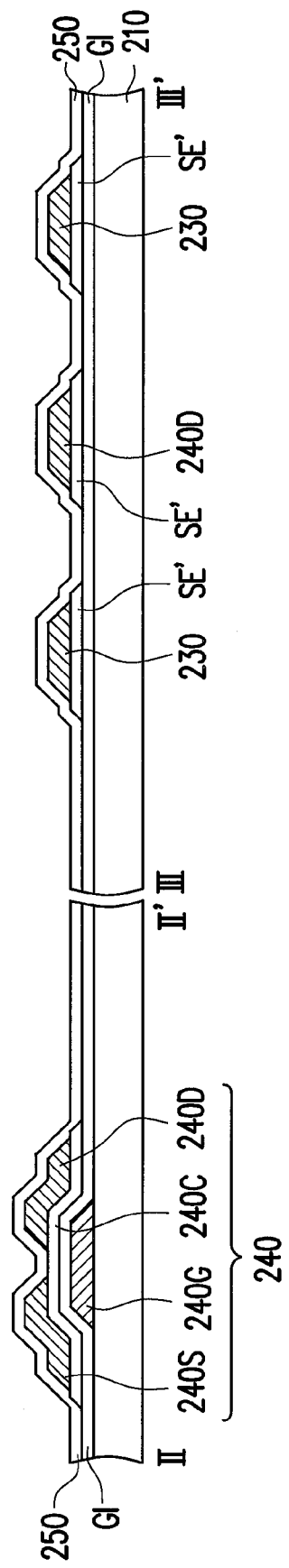

Referring next to FIG. 4E, after the active devices 240 is formed, a first passivation layer 250 is formed on the gate insulating layer GI, so as to cover the scan lines 220, the data lines 230, and the active devices 240. The first passivation layer 250 may further cover the gate insulating layer GI.

Figure 4F:
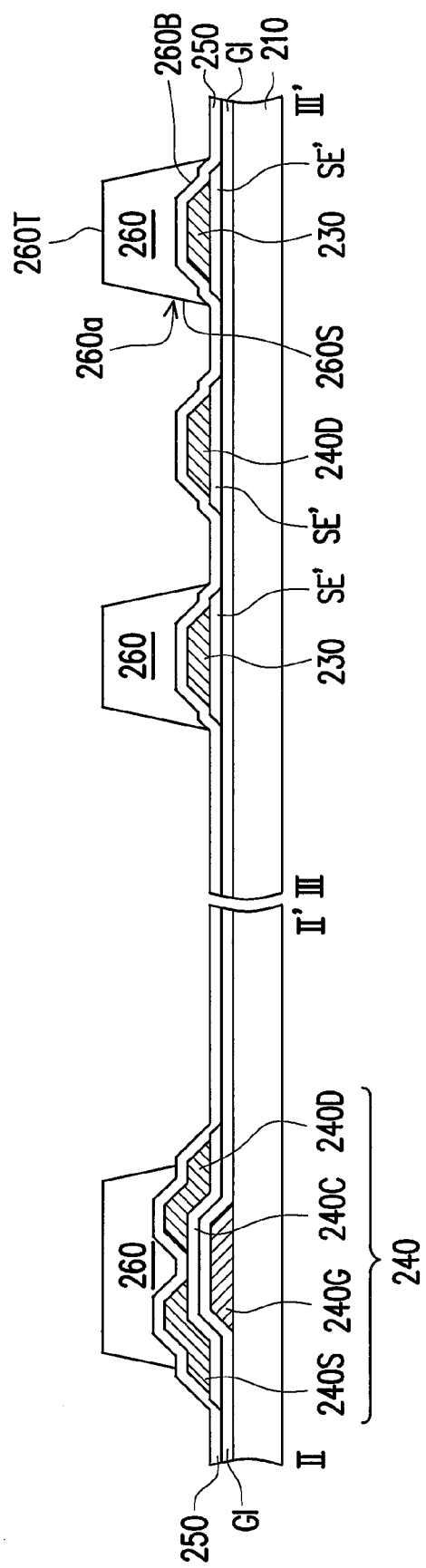
Figure 4F:
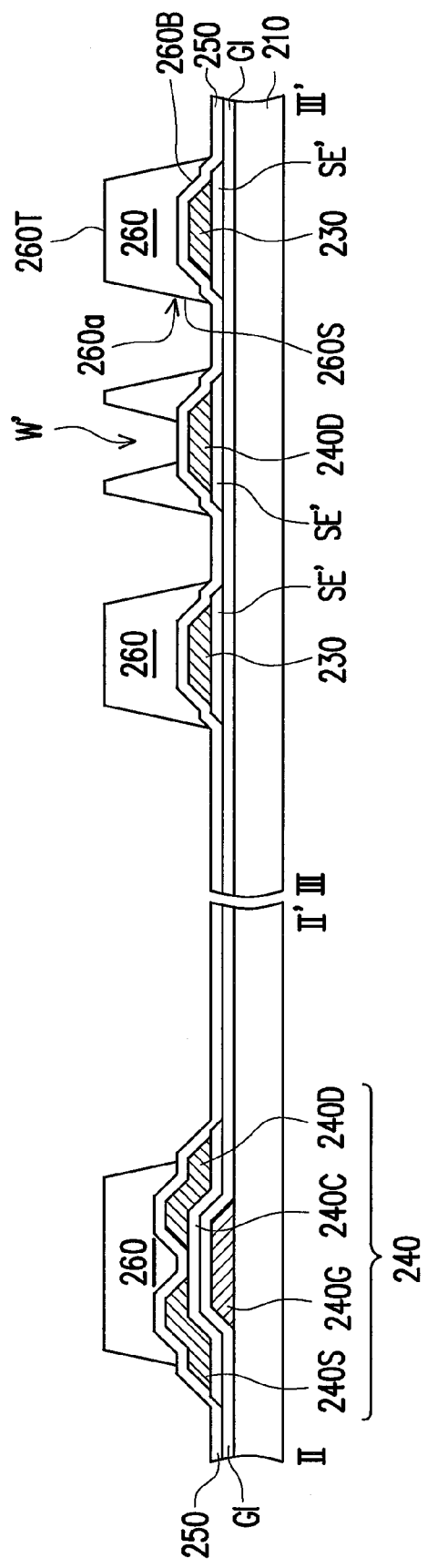

Referring next to FIG. 4F, a transparent pad layer 260 is formed on the first passivation layer 250, and the transparent pad layer 260 is then patterned by a third photolithography and etch process ($3^{rd}$ PEP), whereby the transparent pad layer 260a has a plurality of openings 260a. The openings 260a expose a portion of the first passivation layer 250. In the present embodiment of the invention and as shown in FIG. 2, the passivation layer 260 is located above the scan lines 220 and the data lines 230. Clearly, the transparent pad layer 260 according to the present embodiment can also cover the active devices 240. As shown in FIG. 4F, the transparent pad layer 260 has a top surface 260T, a bottom surface 260B, and a plurality of side surfaces 260S connected between the top surface 260T and the bottom surface 260B. Additionally, the area of the top surface 260T is smaller than the area of the bottom surface 260B, for example.

Figure 4G:
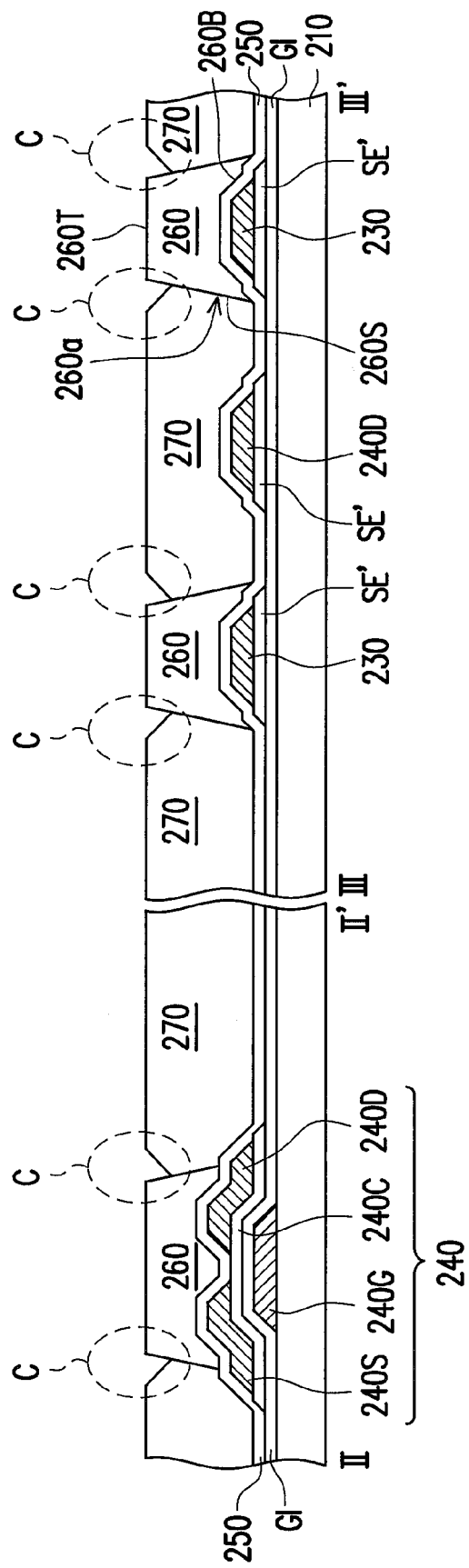
Figure 4G:
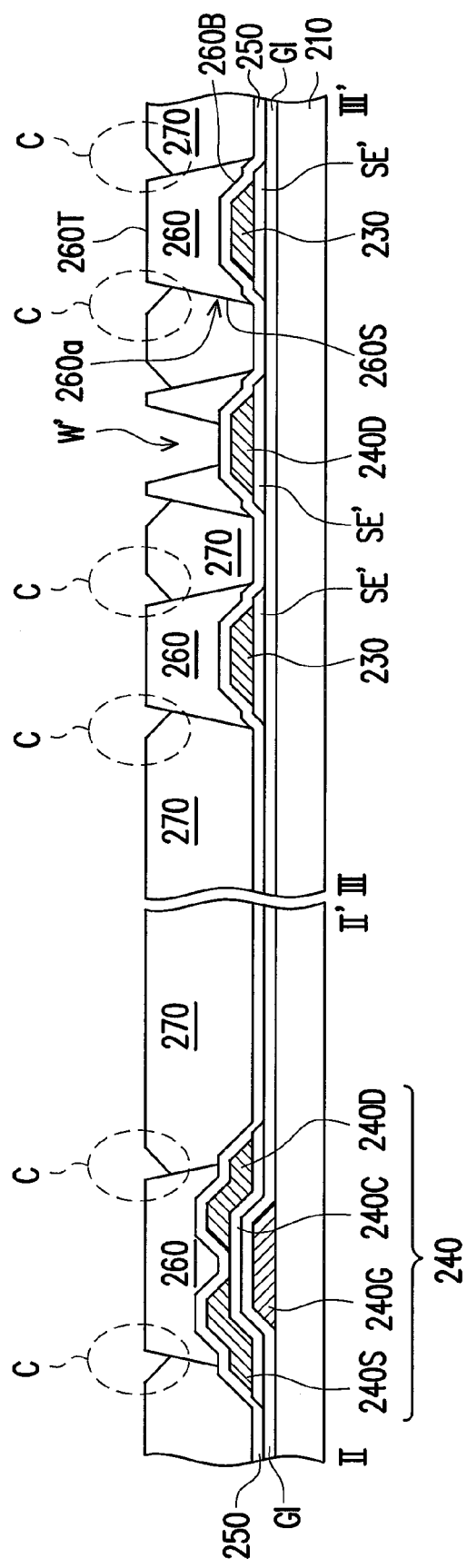

Referring next to FIG. 4G, a color filter pattern 270 is respectively formed in each of the openings 260a of the transparent pad layer 260. Specifically, the color filter patterns 270 are formed on the first passivation layer 250 exposed by the transparent pad layer 260. In the present embodiment of the invention, the color filter patterns 270 include red color filter patterns, green color filter patterns, and blue color filter patterns, for example. Moreover, the color filter patterns 270 are formed by an ink-jet printing process, for instance. Since a contact angle between the color filter patterns 270 and each of the side surfaces 260S of the transparent filter layer 260 is an obtuse angle larger than 90° but smaller than 180°, the color filter patterns 270 and the transparent filter layer 260 have recess C therebetween.

Figure 4H:
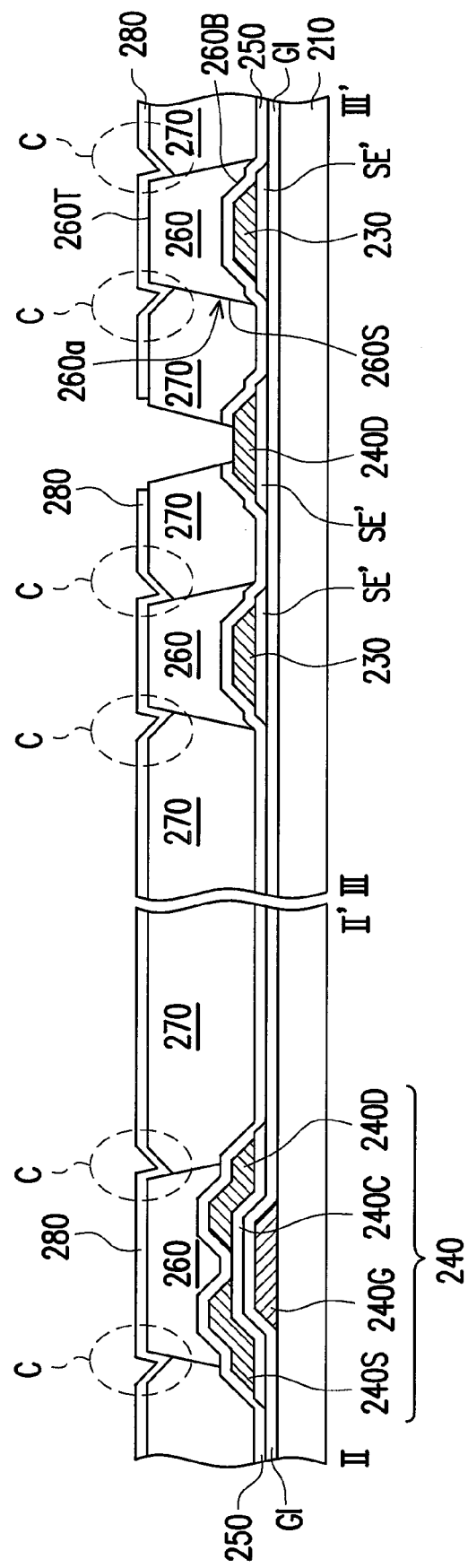
Figure 4H:
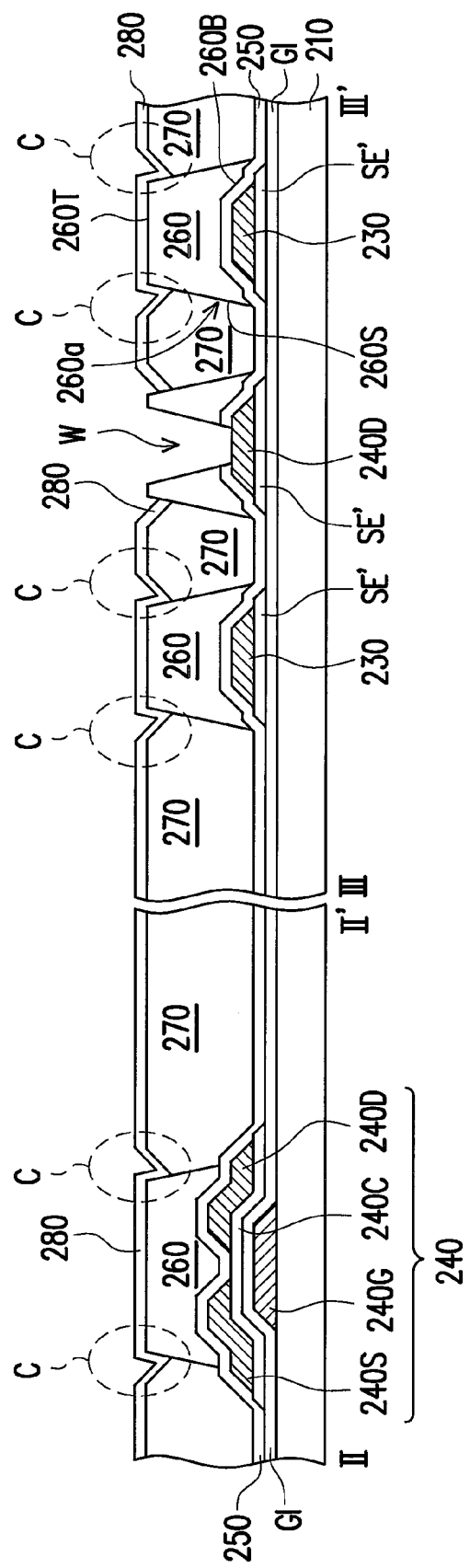

Referring next to FIG. 4H, a second passivation layer 280 is formed on the transparent pad layer 260 and the color filter patterns 270. Thereafter, by a fourth photolithography and etch process ($4^{th}$ PEP), a plurality of contact windows W are formed in the first passivation layer 250, the color filter patterns 270, and the second passivation layer 280. As clearly shown in FIG. 4H, the contact windows W pass through the first passivation layer 250, the color filter patterns 270, and the second passivation layer 280, so as to expose a portion of the drains 240D. As shown in FIG. 4H, the second passivation layer 280 has not extended into the contact windows W. However, in other embodiments of the invention, in order to protect the color filter patterns 270 in the contact windows W, the second passivation layer 280 can be extended into the contact windows W. Consequently, the edge of the second passivation layer 280 is in contact with the upper surfaces of the drains 240D of the active devices 240. In other words, the lower surface of the second passivation layer 280 at the contact windows W is in contact with the sidewall of the color filter patterns 270. Moreover, the edge of the first passivation layer 250 and the edge of the second passivation layer 280 are in contact with the upper surfaces of the drains 240D of the active devices 240.

FIGS. 4F'-4H' illustrate an alternative embodiment to FIGS. 4F-4H. Referring to FIGS. 4F'-4H', in order to further reduce the number of photolithography processes, the contact window W' can be defined by the transparent pad layer 260' (as shown in FIG. 4F'), the color filter patterns 270 can be formed only in the openings 260a between the transparent pad layer 260' and the transparent pad layer 260 (as shown in FIG. 4G'), and the first passivation layer 250 not covered by the transparent pad layer 260' and the color filter patterns 270 can be easily removed (as shown in FIG. 4H'). In other words, while removing the first passivation layer 250 not covered by the transparent pad layer 260' and the color filter patterns 270, the transparent pad layer 260' and the color filter patterns 270 are used as the hard mask.

Figure 4I:
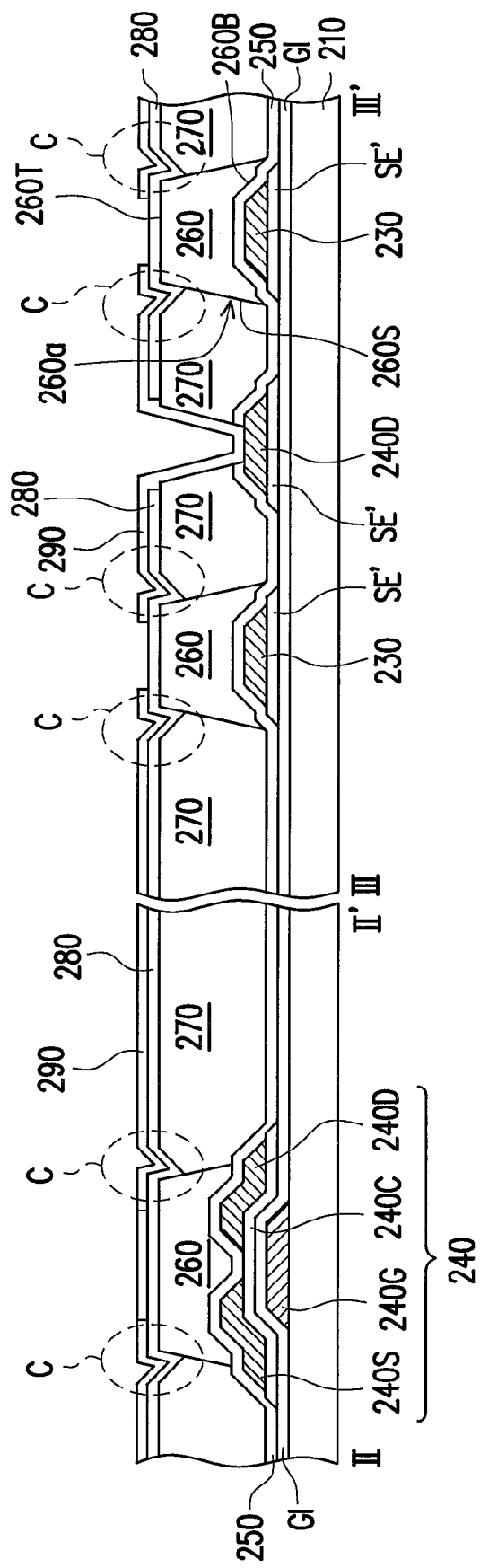

Referring next to FIG. 4I, a plurality of pixel electrodes 290 are formed on the second passivation layer 280, wherein each of the pixel electrodes 290 is electrically connected to the corresponding drain 240D through one of the contact windows, respectively. It should be noted that the pixel electrodes 290 located at the two sides of the scan lines 220 are electrically insulated from each other, so as to expose a portion of the second passivation layer 280. In the present embodiment of the invention, the pixel electrodes 290 are formed by a fifth photolithography and etch process ($5^{th}$ PEP). It should be mentioned that, as shown in FIG. 4H, the second passivation layer 280 has not extended into the contact windows W. At this instance, the lower surface of the pixel electrodes 290 is in contact with the sidewall of the color filter patterns 270 and a portion of the upper surfaces of the drains 240D. In other embodiments of the invention, the aforementioned second passivation layer 280 extends into the contact windows W, thus the edge of the second passivation layer 280 is in contact with the upper surfaces of the drains 240D of the active devices 240. In other words, the lower surface of the second passivation layer 280 at the contact windows W is in contact with the sidewall of the color filter patterns 270. Moreover, the edge of the first passivation layer 250 and the edge of the second passivation layer 280 are in contact with the upper surfaces of the drains 240D of the active devices 240. At this instance, the pixel electrodes 290 located at the contact windows W are in contact with the upper surface of the second passivation layer 280 and the upper surfaces of the drains 240D of the active devices 240.

Figure 4J:
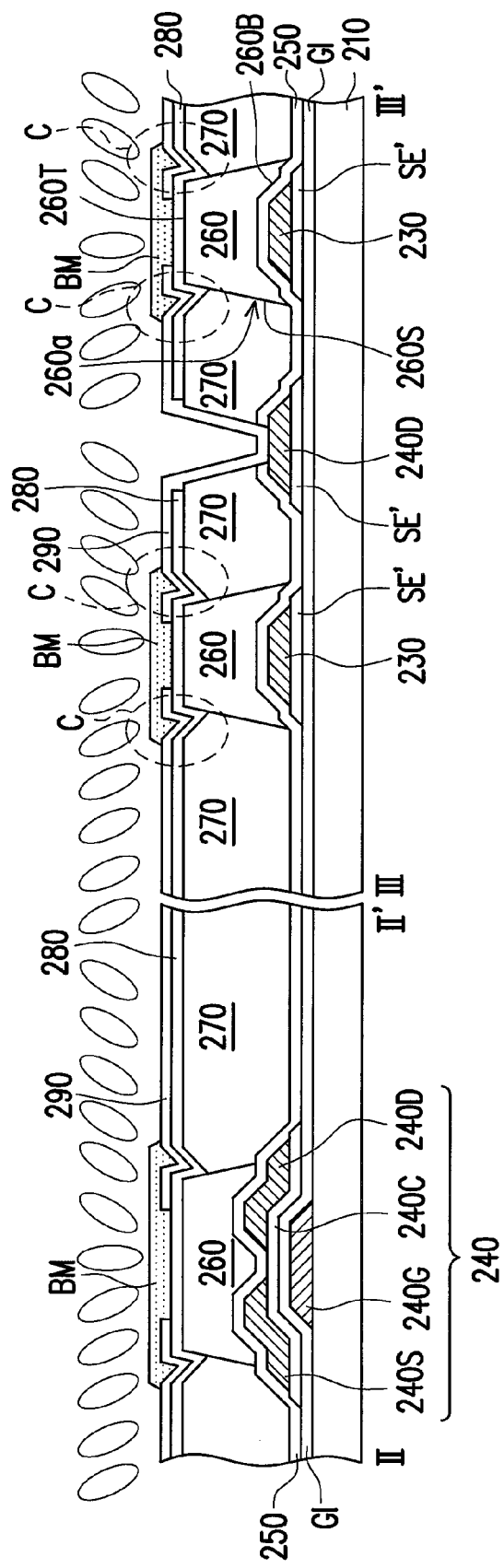

Referring to FIG. 4J, in order to avoid adverse effects caused by the recess C, for example the liquid crystal disclination effect, the present embodiment of the invention forms a black matrix layer BM above the transparent pad layer 260, so as to cover a portion of the pixel electrodes 290. At this instance, the bottom surface of the black matrix layer BM is in contact with an upper surface of the second passivation layer 280 not covered by the pixel electrodes 290 and the pixel electrodes 290 around the recess C. In other words, the black matrix layer BM can fill the recess C. In an example in which the black matrix layer BM has a planar upper surface, the black matrix layer BM alleviate the liquid crystal disclination effect caused by the recess C. Moreover, since the material of the black matrix layer BM is composed of dielectric materials, the capacitor voltage reducing effect of the black matrix layer BM can be utilized to further prevent the disclination issue for the liquid crystal molecules at the recess C. When the material of the black matrix layer BM is composed of conductive materials, the capacitor voltage reduction effect does not exist, but the black matrix layer BM can still alleviate the disclination issue of the liquid crystal molecules in the liquid crystal layer caused by the recess C. It should be noted that, when the material of the black matrix layer BM is composed of conductive materials, the black matrix layer BM can be electrically insulated from the pixel electrodes 290 by configuring the insulating layer between the black matrix layer BM and the pixel electrodes 290. After the black matrix layer BM is formed, because the black matrix layer BM has a planar upper surface, the black matrix layer BM can effectively alleviate the deterioration of display quality due to liquid crystal disclination. As shown in FIG. 4J, the black matrix layer BM has a coverage area that is larger than an area of the bottom surface 260B of the transparent pad layer 260, for example. Additionally, as shown in FIG. 4J, the black matrix layer BM covers a portion of the transparent pad layer 260 and the color filter patterns 270.

It should be noted that, in order to maintain a cell gap between the aforementioned active device array substrate 200 and an opposing substrate, the present embodiment can selectively form a plurality of spacers (not shown) having a proper height on the black matrix layer BM.

In light of the foregoing, since the black matrix layer is disposed above the transparent pad layer according to embodiments of the invention, and the black matrix layer covers a portion of the pixel electrodes, display quality deterioration caused by liquid crystal disclination can be effectively alleviated. Moreover, by using the transparent pad layer as a wall, defects (e.g., the scan lines are broken, the scan lines are shorted with the other lines, the data lines are broken, or the data lines are shorted with the other lines) of the scan lines and data lines can be inspected easily, since the transparent pad layer 260 has good light transmittance.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions. Any of the embodiments or any of the claims of the invention does not need to achieve all of the objects, advantages or features disclosed by the invention. Moreover, the abstract and the headings are merely used to aid in searches of patent files and are not intended to limit the scope of the claims of the invention.

What is claimed is:

1. An active device array substrate, comprising:
    a substrate;
    a plurality of scan lines disposed on the substrate;
    a plurality of data lines disposed on the substrate;
    a plurality of active devices disposed on the substrate, wherein each of the active devices is electrically connected to one of the scan lines and one of the data lines, respectively;
    a first passivation layer covering the scan lines, the data lines, and the active devices;
    a transparent pad layer disposed on the first passivation layer, wherein the transparent pad layer has a plurality of openings, and the transparent pad layer is arranged above the scan lines and the data lines;
    a plurality of color filter patterns disposed in the openings;
    a second passivation layer disposed on the transparent pad layer and the color filter patterns, wherein the first passivation layer, the color filter patterns, and the second passivation layer have a plurality of contact windows;
    a plurality of pixel electrodes disposed on the second passivation layer, wherein each of the pixel electrodes is electrically connected to one of the active devices through one of the contact windows, respectively; and
    a black matrix layer disposed above the transparent pad layer to cover a portion of the pixel electrodes.

2. The active device array substrate as claimed in claim 1, wherein the transparent pad layer has a top surface, a bottom surface, and a plurality of side surfaces connected to the top surface and the bottom surface.

3. The active device array substrate as claimed in claim 2, wherein an area of the top surface is smaller than an area of the bottom surface.

4. The active device array substrate as claimed in claim 2, wherein a contact angle between the color filter patterns and each of the side surfaces is larger than 90°.

5. The active device array substrate as claimed in claim 2, wherein a coverage area of the black matrix layer is larger than the area of the bottom surface.

6. The active device array substrate as shown in claim 1, wherein the black matrix layer covers a portion of the transparent pad layer and the color filter patterns.

7. The active device array substrate as shown in claim 1, wherein the transparent pad layer and the color filter patterns have a recess therebetween, the black matrix layer covering the recess and the black matrix layer has a planar upper surface.

8. The active device array substrate of claim 1, further comprising a plurality of spacers disposed on the black matrix layer.

* * * * *